United States Patent [19]

Ruin

[11] Patent Number: 4,478,331
[45] Date of Patent: Oct. 23, 1984

[54] CONTAINER FOR PRINTED-CIRCUIT BOARDS

[75] Inventor: Jean-Pierre Ruin, Vaucresson, France

[73] Assignee: Jean-Claude Robin, Vaucresson, France

[21] Appl. No.: 393,513

[22] Filed: Jun. 29, 1982

[30] Foreign Application Priority Data

Jul. 9, 1981 [FR] France .................................. 81 13496

[51] Int. Cl.³ .......................... B65D 73/00; B23Q 3/02
[52] U.S. Cl. ...................................... 206/334; 24/498;
206/328; 206/454; 269/93; 269/236
[58] Field of Search ............... 206/328, 330, 331, 332,
206/334, 449, 450, 451, 452, 453, 454, 455, 456,
555, 311; 24/212, 248 B, 248 E, 328, 498, 506,
517, 538, 540, 607; 269/93, 236; 211/40;
410/74, 75, 77, 78, 79, 80, 81, 82, 83, 84;
224/4.42

[56] References Cited

U.S. PATENT DOCUMENTS

| | | |
|---|---|---|
| 744,559 | 11/1903 | Kendrick .............................. 269/93 |
| 792,758 | 6/1905 | Colt ................................... 269/236 |
| 1,995,206 | 3/1935 | Geissbühler ......................... 269/93 |
| 2,401,000 | 5/1946 | Kucyn ................................ 269/236 |
| 2,778,083 | 1/1957 | Imparato ............................. 24/328 |
| 2,908,303 | 10/1959 | Schmidt, Jr. ...................... 269/236 |
| 3,463,343 | 8/1969 | Asenbauer ......................... 220/22 |
| 3,712,606 | 1/1973 | Cole .................................... 269/93 |
| 4,358,035 | 11/1982 | Heidecker ....................... 224/42.42 |

Primary Examiner—George E. Lowrance
Assistant Examiner—Jimmy G. Foster
Attorney, Agent, or Firm—Karl F. Ross; Herbert Dubno

[57] ABSTRACT

A container for the storage or transportation of printed-circuit boards comprises an open-topped box with rectangular support plates inserted in vertical grooves of opposite walls. Each plate has several oblique slots, parallel to one of its diagonals, accommodating sliders by which circuit boards of widely varying sizes can be retained thereon. The sliders can be immobilized on the plate by quick-release clamps and are orientable in mutually perpendicular positions for gripping a horizontal or a vertical edge of a circuit board to be supported on four sides.

10 Claims, 4 Drawing Figures

CONTAINER FOR PRINTED-CIRCUIT BOARDS

FIELD OF THE INVENTION

My present invention relates to a container for the storage or transportation of printed-circuit boards.

BACKGROUND OF THE INVENTION

The handling of printed-circuit boards, comprising conductors molded into a resinous matrix and joined to components projecting from a surface thereof, is a rather delicate matter because of their fragility and high cost of replacement. During storage and especially transportation, therefore, care must be taken to prevent such boards from coming into contact with one another or with extraneous objects.

Containers, generally in the form of prismatic receptacles of rectangular outline, are known in which such printed-circuit boards can be stored parallel to one another with the aid of spacing means usually designed as internal ribs on opposite wall surfaces, the boards being insertable into grooves defined by these ribs. A container of this type, however, can accommodate only boards of a given size in at least one dimension. It has also been proposed (see U.S. Pat. No. 4,261,465) to provide the receptacle with an internal divider, having grooves confronting those of the container walls, which can be shifted in order to hold circuit boards of different lengths. Even in that case, however, all the boards stored simultaneously in a given container must be of the same length.

OBJECTS OF THE INVENTION

The general object of my present invention, therefore, is to provide an improved container for the purpose set forth which can hold an assembly of circuit boards varying widely in size.

A more particular object is to provide means in such a container for securely holding the various boards in position with the necessary minimum separation but with optimum utilization of the available space.

SUMMARY OF THE INVENTION

I realize these objects, in accordance with my present invention, by providing a box with an open side through which a plurality of generally rectangular plates are insertable for engagement by spacing means holding these plates substantially parallel to one another inside the box; the spacing means may be constituted, as in conventional containers of this sort, by a set of ribs perpendicular to that open side on at least one pair of opposite walls. Each plate is provided, on at least one of its surfaces, with a plurality of guide tracks and with sliders displaceable therealong over a major part of that surface for retaining a printed-circuit board therebetween.

The guide tracks, advantageously, are represented by oblique slots—at least two per plate—extending substantially parallel to one of the diagonals of the rectangle. A total of four sliders, two per slot, will then suffice for securely supporting a circuit board with edges parallel to those of the associated plate, each board edge being engaged by one slider. Such an arrangement alone will accommodate circuit boards ranging in height and width up to almost the corresponding dimensions of the plate; in a few intances, e.g. for boards which are much larger in one dimension than in the other, two additional guide slots may be needed.

The sliders are advantageously provided with quick-release clamps enabling their immobilization in any selected position along the guide tracks to which they are removably fitted. These clamps ought to enable their orientation in mutually perpendicular positions for gripping either a horizontal or a vertical edge of an associated circuit board.

BRIEF DESCRIPTION OF THE DRAWING

The above and other features of my invention will now be described in detail with reference to the accompanying drawing in which.

SPECIFIC DESCRIPTION

Figure 1:
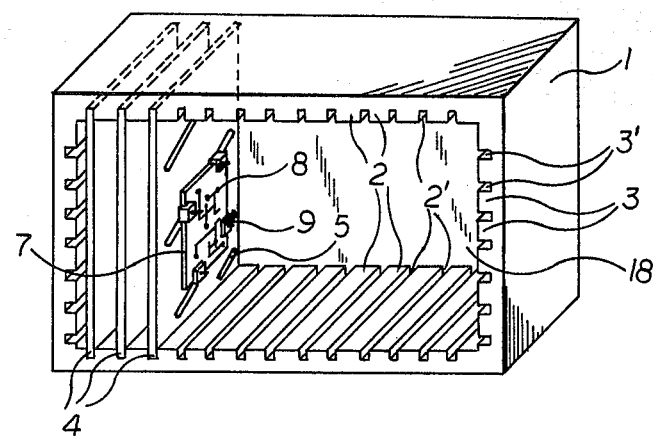
FIG. 1 is a perspective top view of a circuit-board container according to my invention.

FIG. 1 shows an open-topped prismatic box 1 of rectangular cross-section. The major sides of the rectangle are defined by walls whose inner surfaces have vertical ribs 2 defining a multiplicity of parallel grooves 2' therebetween; the other pair of walls, extending along the minor sides of the rectangle, similarly have inner surfaces with vertical ribs 3 defining parallel grooves 3'. Only the grooves 2' are being utilized in the embodiment described hereinafter in which support plates 4, preferably of synthetic resin, are inserted from above into these grooves in spaced-apart parallel relationship. Obviously, however, similar plates of greater width could be accommodated in box 1 by being inserted into grooves 3'. The box has a closed bottom 18 on which the inserted plates come to rest.

Figure 2:
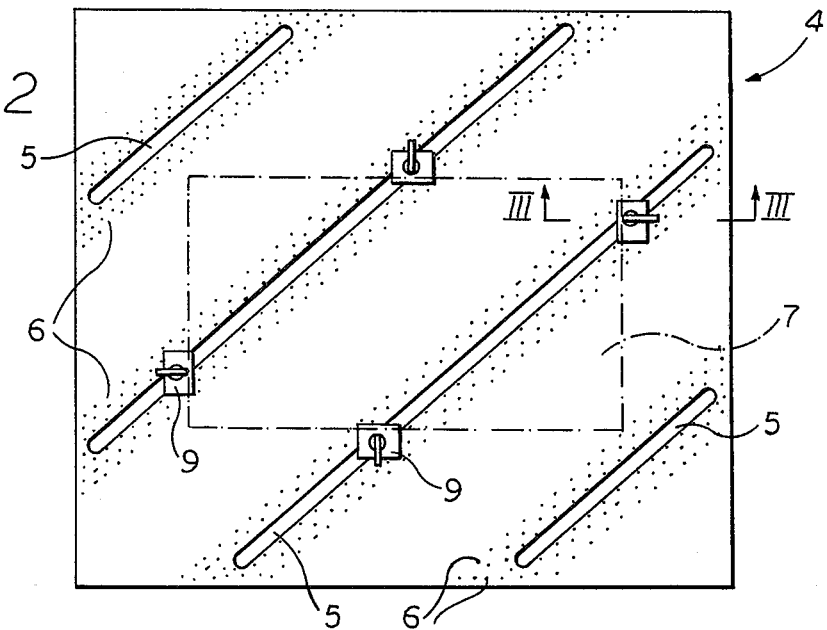
FIG. 2 is an elevational view, drawn to a larger scale, of a support plate insertable into the container of FIG. 1.

Each plate 4, whose structure is shown more clearly in FIG. 2, has four throughgoing slots 5 parallel to a diagonal thereof. The two longer slots, which are symmetrically positioned about that diagonal, are each fitted with two sliders 9 engaging respective edges of a printed-circuit board 7 which are parallel to the edges of plate 4. FIG. 1 shows this circuit board 7 as carrying a number of projecting components 8 soldered in the usual manner to a network of conductor strips; these components will generally have a height not exceeding that of the sliders 9 which in turn conveniently fit into the spaces defined by the width of the ribs 2. The two shorter slots 5, also symmetrical about the plate diagonal, will be needed only in exceptional cases.

Figure 3:
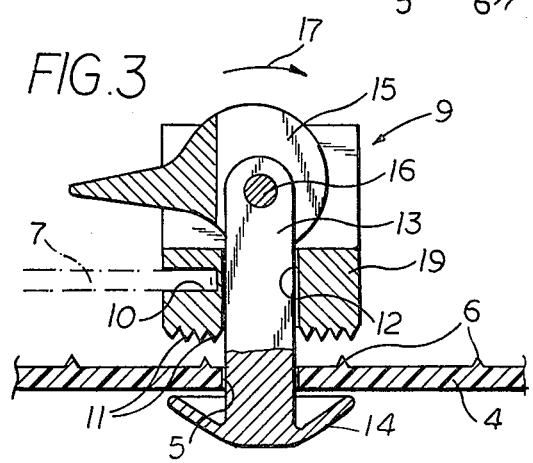
FIG. 3 is a further-enlarged sectional detailed view of a sliding clamp, taken on the line III—III to FIG. 2.
Figure 4:
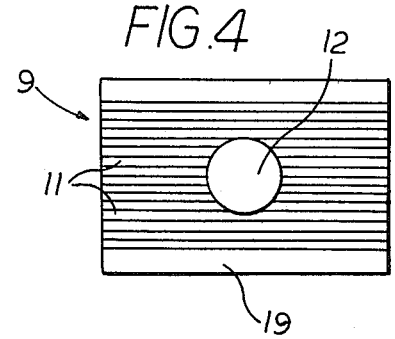
FIG. 4 is a bottom view of a clip forming part of the clamp shown in FIG. 3.

Each slider 9 has a structure as shown in FIGS. 3 and 4, comprising a stem 13 which traverses the associated slot 5 and has a head 14 bearing upon the surface of plate 4 remote from the circuit board 7 supported thereby. An edge of that circuit board is received, preferably with frictional fit, in a lateral recess 10 of a clip 19 which has a bore 12 traversed by stem 13 and has two jaws bridged by a pin 16 which passes through the free end of the stem. A lever 15 has an eccentric bifurcation which straddles that free end and is traversed by the pin 16; when the lever is swung clockwise from a released position illustrated in FIG. 3, as indicated by an arrow 17, its eccentric bifurcation cammingly engages the perforated base of clip 19 and drives it toward the head 14 of stem 13 so as to clamp the plate 4 between that head and the clip.

Depending on whether the clip 19 is to engage a horizontal or a vertical edge of board 7 as viewed in FIG. 2, the clip can be rotated in slot 5 into one of two mutually orthogonal positions. For a more positive engagement of the clip with the plate 4 it is advantageous, as shown in FIGS. 3 and 4, to provide a face of the clip confronting the plate 4 with indentations in the form of a multiplicity of very narrow grooves 11 coacting with an orthogonal array of closely spaced transverse projections in the form of pointed teeth 6 disposed on a surface zone of plate 4 in the vicinity of each slot. The coaction of grooves 11 with teeth 6 will securely immobilize the clip in one or the other of the aforementioned orthogonal positions.

Although FIG. 3 shows the clip 19 as having only one lateral recess 10, one or more additional recesses may be provided on the same side or on different sides of the clip to allow for a variable spacing of board 7 from plate 4. It is also possible to equip the clip with additional clamping means for the circuit board or to modify the shape of lever 15 so that the force exerted upon the clip 19 in its alternate position also clamps the board 7 in its recess 10. The provision of such recesses on different sides of the clip will also enable the mounting of two circuit boards, with the aid of three additional sliders and utilization of the shorter slots 5, on the same support plate 4.

I claim:

1. A container for the storage for rectangular printed-circuit boards, comprising:

a rectangular prismatic box having an open side;

a plurality of rectangular plates insertable into said box through said open side; and spacing means inside said box engageable by said plates for holding same substantially parallel to one another and to a pair of walls of said box, each of said plates being provided on at least one surface with a pair of guide tracks extending substantially parallel to a diagonal of the respective plate and with two sliders per guide track displaceable therealong over a major part of said surface for retaining a printed-circuit board therebetween with edges parallel to those of said plates by engagement of each board edge with a respective slider, said guide tracks being throughgoing slots, each of said sliders including a stem traversing an associated slot, a clip on said stem engageable with an edge of a printed-circuit board, and locking means for immobilizing said clip in a slected position along the associated slot, said stem having a head bearing upon a plate surface opposite said clip, said locking means comprising a lever pivotable on said stem and cammingly engageable with said clip for clamping the respective plate between said clip and said head, said clip having a grooved face confronting a plate surface provided with pointed teeth receivable in the grooves of said face, said teeth being arrayed along mutually perpendicular lines parallel to the sides of said plate.

2. A container as defined in claim 1 wherein said clip is rotatable on said stem for selective engagement with mutually perpendicular edges of a printed-circuit board.

3. A container as defined in claim 1 wherein said guide tracks are symmetrically disposed about a diagonal of the respective plate.

4. A container as defined in claim 1 or 3 wherein said spacing means comprises a set of ribs perpendicular to said open side on at least one pair of opposite walls thereof.

5. A container as defined in claim 1 or 3 wherein each of said plates is further provided on said one surface with a second pair of guide tracks paralleling the guide tracks of the first pair for retaining another printed-circuit board by means of additional sliders displaceable therealong.

6. A container for printed-circuit boards, comprising:

a box having an open side;

a plurality of generally rectangular plates insertable into said box through said open side; and spacing means inside said box engageable by said plates for holding same substantially parallel to one another in said box, each of said plates being provided with a plurality of guide tracks in the form of throughgoing slots and with sliders displaceable along said slots over a major part of a first surface thereof for retaining a printed-circuit board therebetween, said first surface being provided with a set of transverse projections alongside each of said slots, each of said sliders including a stem traversing an associated slot, a clip on said stem engageable with an edge of a printed-circuit board, a head bearing upon a second plate surface opposite said clip, and a lever pivotable on said stem and cammingly engageable with said clip for clamping the respective plate between said clip and said head, said clip having an indented face confronting said first surface and coacting with said projections for relatively immobilizing said clip in different angular positions relative to said plate.

7. A container as defined in claim 6 wherein said projections are pointed teeth receivable in parallel grooves of said indented face, said teeth being arrayed along mutually perpendicular lines parallel to the sides of said plate.

8. A container as defined in claim 6 or 7 wherein said guide tracks extend substantially parallel to a diagonal of the respective plate.

9. A container as defined in claim 8 wherein each plate is provided with at least two guide tracks symmetrically disposed about said diagonal.

10. A container as defined in claim 6, 8 or 9 wherein said box is rectangularly prismatic and said spacing means comprises a set of ribs perpendicular to said open side on at least one pair of opposite walls thereof.

* * * * *